United States Patent
Fossum et al.

(10) Patent No.: US 8,625,016 B2
(45) Date of Patent: Jan. 7, 2014

(54) IMAGE SENSORS HAVING MULTIPLE PHOTOELECTRIC CONVERSION DEVICES THEREIN

(75) Inventors: Eric Fossum, Wolfeboro, NH (US); Suk Pil Kim, Gyeonggi-do (KR); Yoon Dong Park, Gyeonggi-do (KR); Hoon Sang Oh, Gyeonggi-do (KR); Hyung Jin Bae, Gyeonggi-do (KR); Tae Eung Yoon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 352 days.

(21) Appl. No.: 12/958,799

(22) Filed: Dec. 2, 2010

(65) Prior Publication Data

US 2011/0128430 A1 Jun. 2, 2011

(30) Foreign Application Priority Data

Dec. 2, 2009 (KR) .................. 10-2009-0118151

(51) Int. Cl.
*H04N 5/335* (2011.01)
*H01L 31/062* (2012.01)
*H01L 21/02* (2006.01)
*H01L 21/00* (2006.01)

(52) U.S. Cl.
USPC ............ 348/308; 257/291; 257/437; 257/447

(58) Field of Classification Search
None
See application file for complete search history.

(56) References Cited

U.S. PATENT DOCUMENTS

| | | | |
|---|---|---|---|
| 6,934,050 B2 * | 8/2005 | Merrill et al. ............... | 358/1.16 |
| 7,407,830 B2 | 8/2008 | Hong | |
| 2006/0201546 A1 * | 9/2006 | Yokoyama ................... | 136/263 |
| 2008/0277701 A1 * | 11/2008 | Lee et al. ...................... | 257/292 |
| 2008/0303072 A1 * | 12/2008 | Lee et al. ...................... | 257/292 |
| 2009/0011532 A1 * | 1/2009 | Shimotsusa et al. .......... | 438/59 |
| 2009/0053848 A1 * | 2/2009 | Fan ................................ | 438/59 |
| 2009/0135284 A1 * | 5/2009 | Altice et al. ................. | 348/308 |
| 2009/0200584 A1 * | 8/2009 | Tweet et al. .................. | 257/292 |
| 2009/0200585 A1 * | 8/2009 | Nozaki et al. ................ | 257/292 |
| 2009/0200626 A1 | 8/2009 | Qian et al. | |
| 2010/0118173 A1 * | 5/2010 | Toros et al. .................. | 348/302 |
| 2010/0276670 A1 * | 11/2010 | Shen et al. ..................... | 257/40 |
| 2010/0323470 A1 * | 12/2010 | Venezia et al. ................ | 438/72 |
| 2011/0063470 A1 * | 3/2011 | Kudoh ........................ | 348/222.1 |
| 2012/0019695 A1 * | 1/2012 | Qian et al. .................... | 348/273 |

FOREIGN PATENT DOCUMENTS

JP  2008-258430  10/2008

* cited by examiner

*Primary Examiner* — Lin Ye
*Assistant Examiner* — John H Morehead, III
(74) *Attorney, Agent, or Firm* — Myers Bigel Sibley & Sajovec, P.A.

(57) ABSTRACT

Image sensors include a second photoelectric conversion device disposed in a lower portion of a substrate and a first photoelectric conversion device extending between the secondary photoelectric conversion device and a light receiving surface of the substrate. Electrical isolation between the first and second photoelectric conversion devices is provided by a photoelectron barrier, which may be an optically transparent electrically insulating material. MOS transistors may be utilized to transfer photoelectrons generated within the first and second photoelectric conversion devices to a floating diffusion region within the image sensor. These transistors may represent one example of means for transferring photoelectrons generated in the first and second photoelectric conversion devices to a floating diffusion region in the substrate, in response to first and second gating signals, respectively. The first and second gating signals may be active during non-overlapping time intervals.

17 Claims, 11 Drawing Sheets

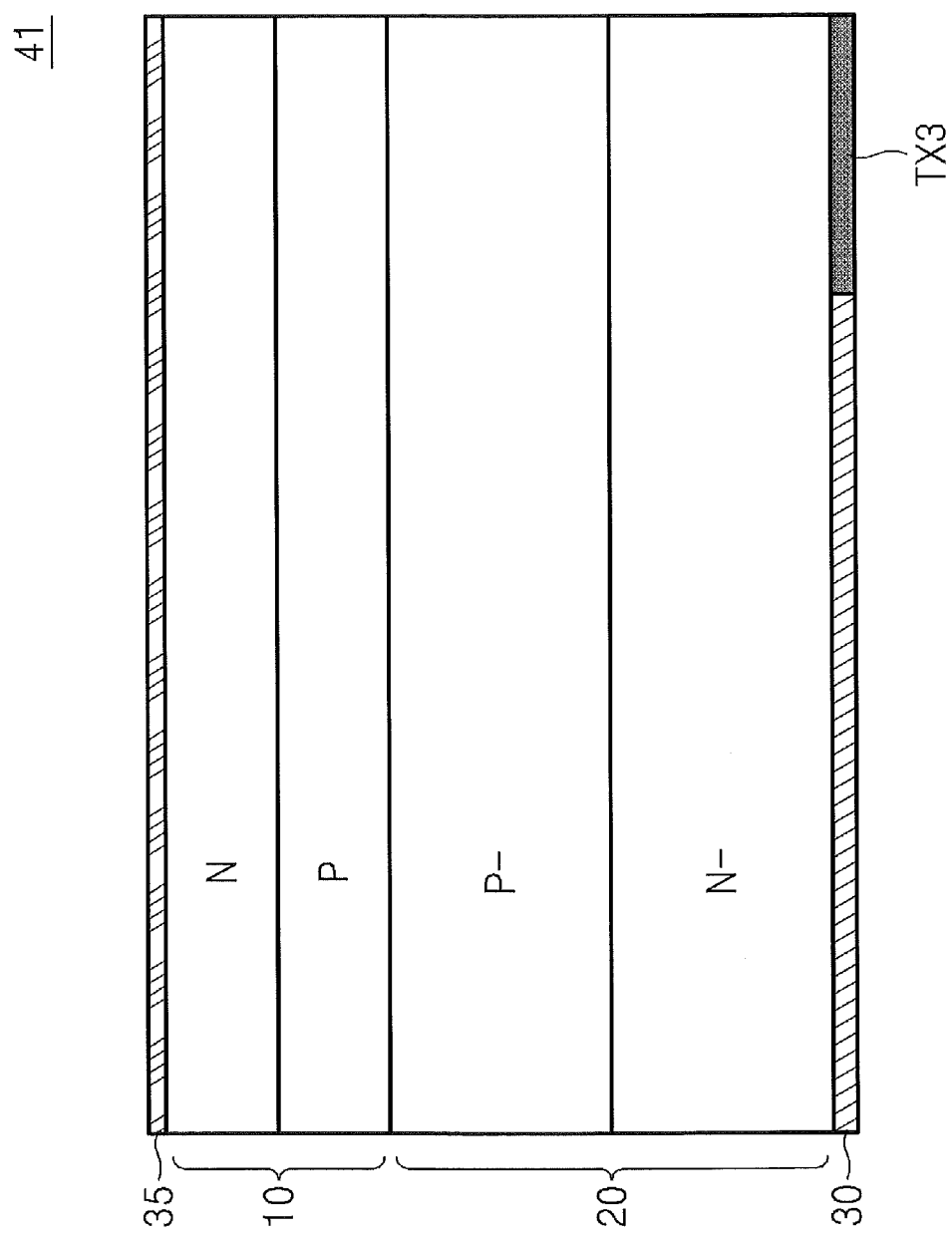

US 8,625,016 B2

IMAGE SENSORS HAVING MULTIPLE PHOTOELECTRIC CONVERSION DEVICES THEREIN

REFERENCE TO PRIORITY APPLICATION

This application claims the benefit of Korean Patent Application No. 10-2009-0118151, filed Dec. 2, 2009, the contents of which are hereby incorporated herein by reference.

FIELD OF THE INVENTION

Embodiments of the invention relate to image processing technologies and, more particularly, to image sensors having two-layer structures, image processing apparatus including the same and manufacturing methods of image sensors.

BACKGROUND

The image sensor is a device that converts optical signals to digital signals. A general image sensor includes a plurality of pixels and a signal processing circuit. Each of the plurality of pixels includes a photoelectric conversion element and a plurality of transistors. The plurality of transistors are used to transmit a pixel signal generated by the photoelectric conversion element to the signal processing circuit.

The signal processing circuit generates digital signals corresponding to optical signals by processing a pixel signal output from each of the plurality of pixels. A display device displays a digital image corresponding to an optical image in response to digital signals output from the signal processing circuit. An image quality of a digital image is affected not only by a signal processing function of a signal processing circuit, but also by the pixel structure that converts an optical signal to an electrical signal.

SUMMARY

Image sensor embodiments according to embodiments of the invention include a second photoelectric conversion device disposed in a lower portion of a substrate and a first photoelectric conversion device extending between the secondary photoelectric conversion device and a light receiving surface of the substrate. Electrical isolation between the first and second photoelectric conversion devices can be provided by a photoelectron barrier, which may be an optically transparent electrically insulating material, such as silicon dioxide, silicon nitride or silicon oxynitride. According to some additional embodiments of the invention, MOS transistors may be utilized to transfer photoelectrons generated within the first and second photoelectric conversion devices to a floating diffusion region within the image sensor. These transistors may represent an example of means for transferring photoelectrons generated in the first and second photoelectric conversion devices to a floating diffusion region in the substrate, in response to first and second gating signals, respectively. These first and second gating signals may be active during non-overlapping time intervals.

According to additional embodiments of the invention, the first and second photoelectric conversion devices may be first and second PN rectifying junctions, respectively. In particular, the second PN rectifying junction within the second photoelectric conversion device may be more lightly doped with P-type and N-type impurities relative to the first PN rectifying junction. Moreover, the photoelectron barrier may be configured so that it forms a first interface (e.g., insulator/semiconductor interface) with a P-type region in the first photoelectric conversion device and a second interface with a P-type region in the second photoelectric conversion device. A reflection film may also be provided on a surface of the substrate extending opposite the light receiving surface.

According to still further embodiments of the invention, an image sensor is provided with a second photoelectric conversion device in a substrate and a first photoelectric conversion device extending between the secondary photoelectric conversion device and a light receiving surface of the substrate. A transparent electrode is also provided on the light receiving surface. This transparent electrode may form a nonrectifying junction with an N-type region within the first photoelectric conversion device. The first and second photoelectric conversion devices may also be configured so that a P-type region within the first photoelectric conversion device forms a nonrectifying junction with a P-type region within the second photoelectric conversion device.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 6 shows a sectional diagram of a pixel of an image sensor according to another example embodiment;

DETAILED DESCRIPTION OF THE PREFERRED EMBODIMENTS

Figure 1:
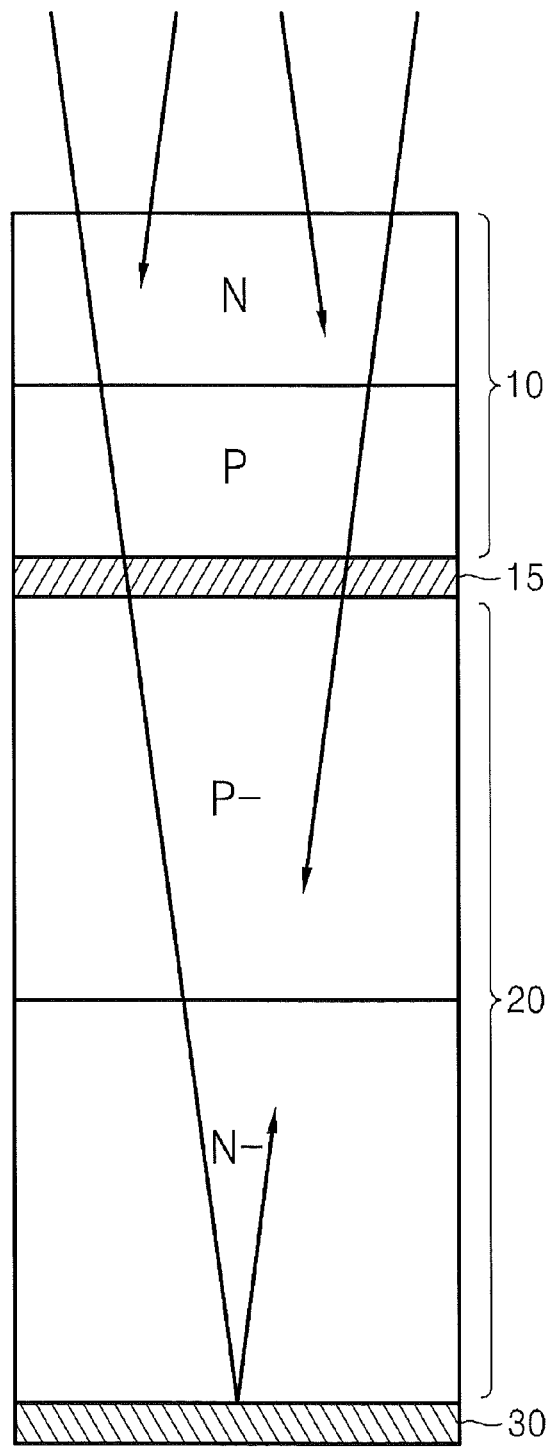
FIG. 1 shows a sectional diagram of a pixel of an image sensor according to an example embodiment of the present invention.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 shows a sectional diagram of a pixel of an image sensor according to an example embodiment of the present invention. Referring to FIG. 1, a pixel 40 of an image sensor includes a first photoelectric conversion element (or layer) 10, a photoelectron barrier 15, a second photoelectric conversion element (or layer) 20 and a reflection film 30.

The first photoelectric conversion element 10 may generate a first electrical signal (e.g., a photocharge), in response to incident light (e.g., an incident light penetrating a filter). The first photoelectric conversion element 10 may be embodied as a photodiode, a photo transistor or a pinned photodiode as a photo sensitive element. For example, the first photoelectric conversion element 10 may be a PN-junction diode where a P-type semiconductor layer P and an N-type semiconductor layer N are formed or stacked. The first photoelectric conversion element 10 may be embodied within 1000 nm from surface of a semiconductor substrate.

The photoelectron barrier 15 formed at (or under) a lower part of the first photoelectric conversion element 10 may prevent diffusion of a first electrical signal, which is generated by the first photoelectric conversion element 10, to the second photoelectric conversion element 20 or diffusion of a second electrical signal, which is generated by the second photoelectric conversion element 20, to the first photoelectric conversion element 10.

The photoelectron barrier 15 may be formed with a silicon oxide film (or layer) SiO2, a silicon nitride film (or layer) SiN or a silicon oxynitride film (or layer) SiON.

The second photoelectric conversion element 20 formed at (or under) a lower part of the photoelectron barrier 15 may generate a second electrical signal in response to an incident light penetrating the photoelectron barrier 15. The second photoelectric conversion element 20 may be embodied into a photodiode, a photo transistor or a pinned photodiode as a photo sensitive element. For example, the second photoelectric conversion element 20 may be a PN-junction diode where a P-type semiconductor layer $P^-$ and an N-type semiconductor layer $N^-$ are formed or stacked. The second photoelectric conversion element 20 may be embodied between 1000 nm to 3000 nm from surface of a semiconductor substrate.

To prevent dark current from occurring in a pixel 40 of an image sensor, a P-type semiconductor layer may further be formed at (on or over) an upper part of the first photoelectric conversion element 10. Each semiconductor layer N, P, $P^-$ and $N^-$ may be embodied with an organic semiconductor material, Alq3(Tris(8-hydroxyquinolinato) aluminum), a quinacridone compound or nanosilicon.

The reflection film 30 may be formed at (or under) a lower part of the second photoelectric conversion element 20 and reflect an incident light penetrating the second photoelectric conversion element 20 to inside of the second photoelectric conversion element 20. That is, the pixel 40 of an image sensor may be embodied into a two-layer photoelectric conversion element.

A color filter, which may be formed at (on or over) an upper part of the first photoelectric conversion element 10, may be a white filter, a red filter, a green filter, a blue filter, a yellow filter, a magenta filter or a cyan filter. Accordingly, depending on a color filter formed at an upper part of the first photoelectric conversion element 10, wavelengths of an incident light incident to the first photoelectric conversion element 10 and wavelengths incident to the second photoelectric conversion element 20 may be selected.

Figure 2:
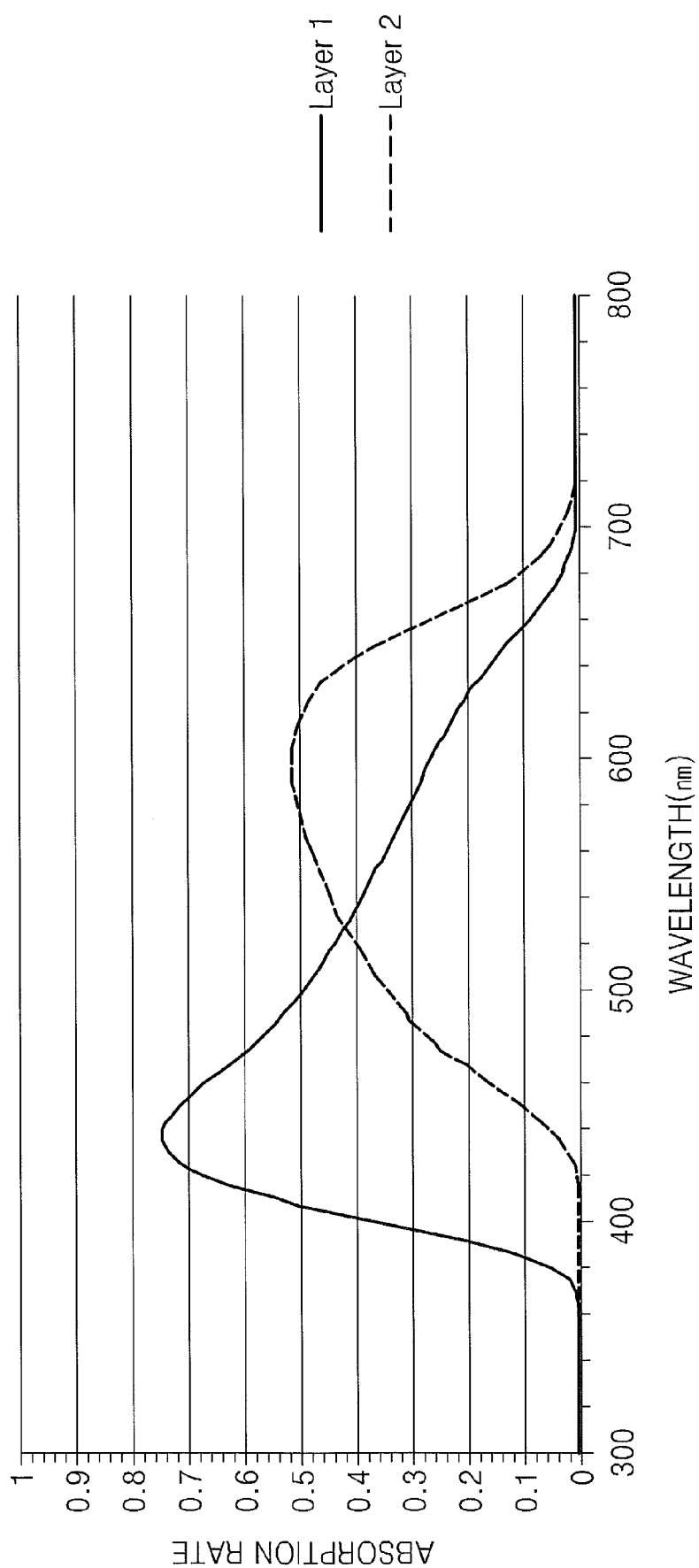
FIG. 2 is a graph showing an absorption rate of a pixel of the image sensor illustrated in FIG. 1 and an absorption rate of a pixel of a conventional image sensor.

FIG. 2 is a graph showing an absorption rate of a pixel of the image sensor illustrated in FIG. 1 and an absorption rate of a pixel of a conventional image sensor according to wavelengths. Referring of FIG. 2, a layer 1 shows an absorption rate or transmittance according to a wavelength of a pixel of a conventional image sensor embodied with a layer, and a layer 2 shows an absorption rate or transmittance according to a wavelength of the pixel 40 of an image sensor, which is embodied with two layers 10 and 20, according to embodiments of the present invention.

As illustrated by FIG. 2, an absorption rate or transmittance of a pixel of a conventional image sensor is high in only certain wavelengths of incident visible light (e.g., wavelengths in a blue region). However, an absorption rate or transmittance of the pixel 40 of an image sensor of the present invention is more constant in a wider range of wavelengths of incident visible light.

Figure 3:
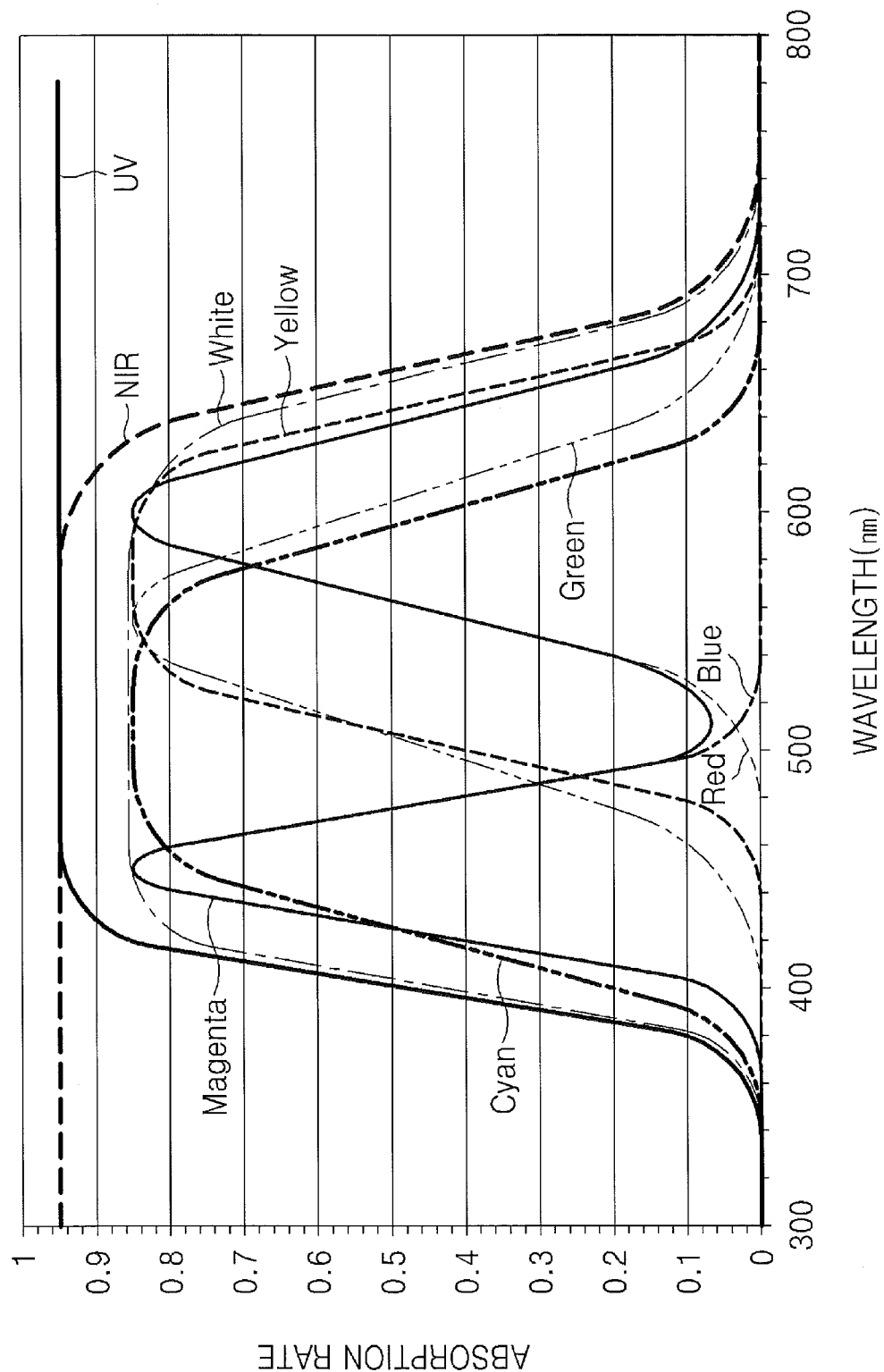
FIG. 3 shows a relative absorption rate according to wavelengths detected in a pixel of the image sensor illustrated in FIG. 1.

FIG. 3 shows a relative absorption rate according to wavelengths, which may be detected in a pixel of the image sensor illustrated in FIG. 1. Referring to FIG. 3, wavelengths detected in the pixel 40 of an image sensor embodied with the 2-layer elements 10 and 20 may be wavelengths in a near infrared light region (NIR), wavelengths in a white region (White), wavelengths in a magenta region (Magenta), wavelengths in a cyan region (Cyan), wavelengths in a yellow region (Yellow), wavelengths in a red region (Red), wavelengths in a green region (Green), wavelengths in a blue region (Blue) or wavelengths in an ultraviolet ray region (UV). FIG. 3 illustrates a relative absorption rate of each wavelength.

Figure 4:
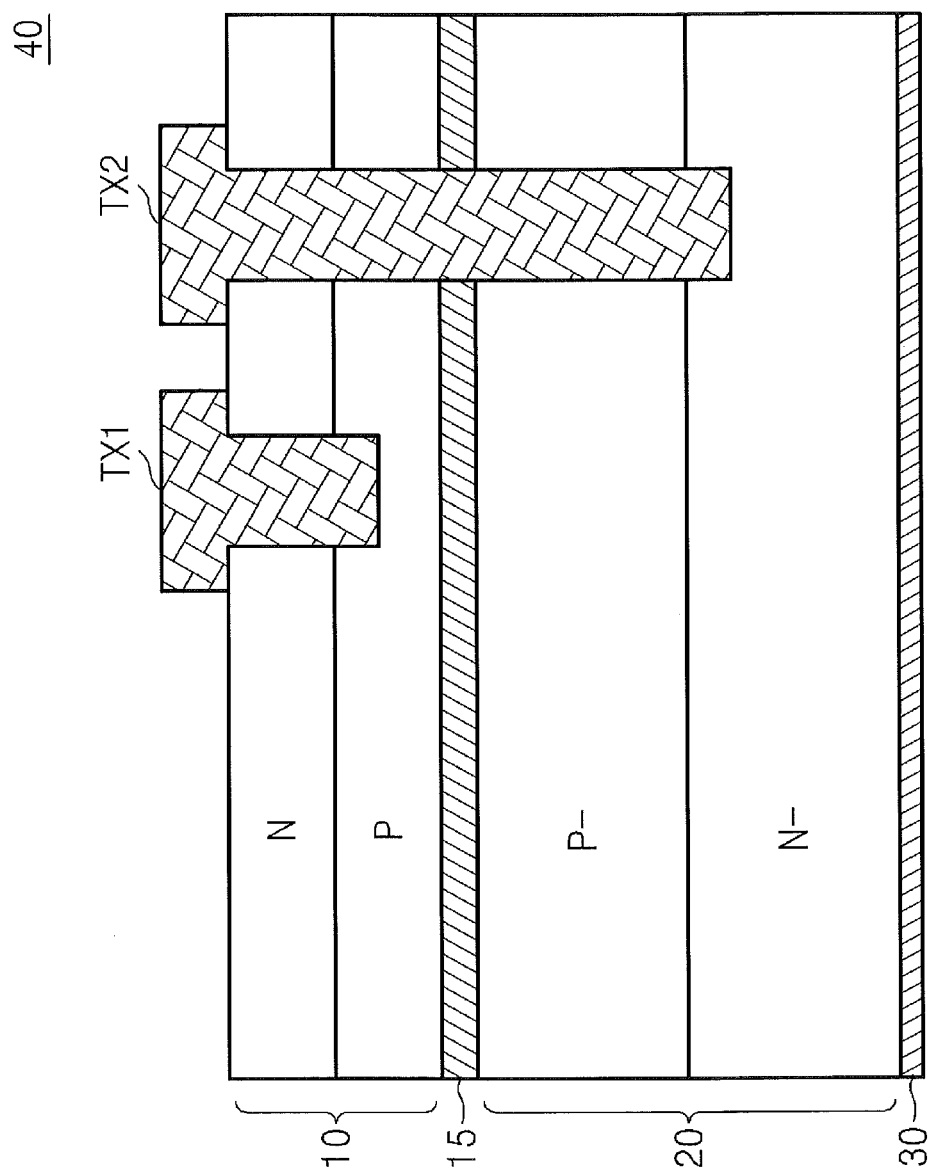
FIG. 4 shows a sectional diagram of a pixel of an image sensor including transfer gates according to an example embodiment of the present invention.
Figure 5A:
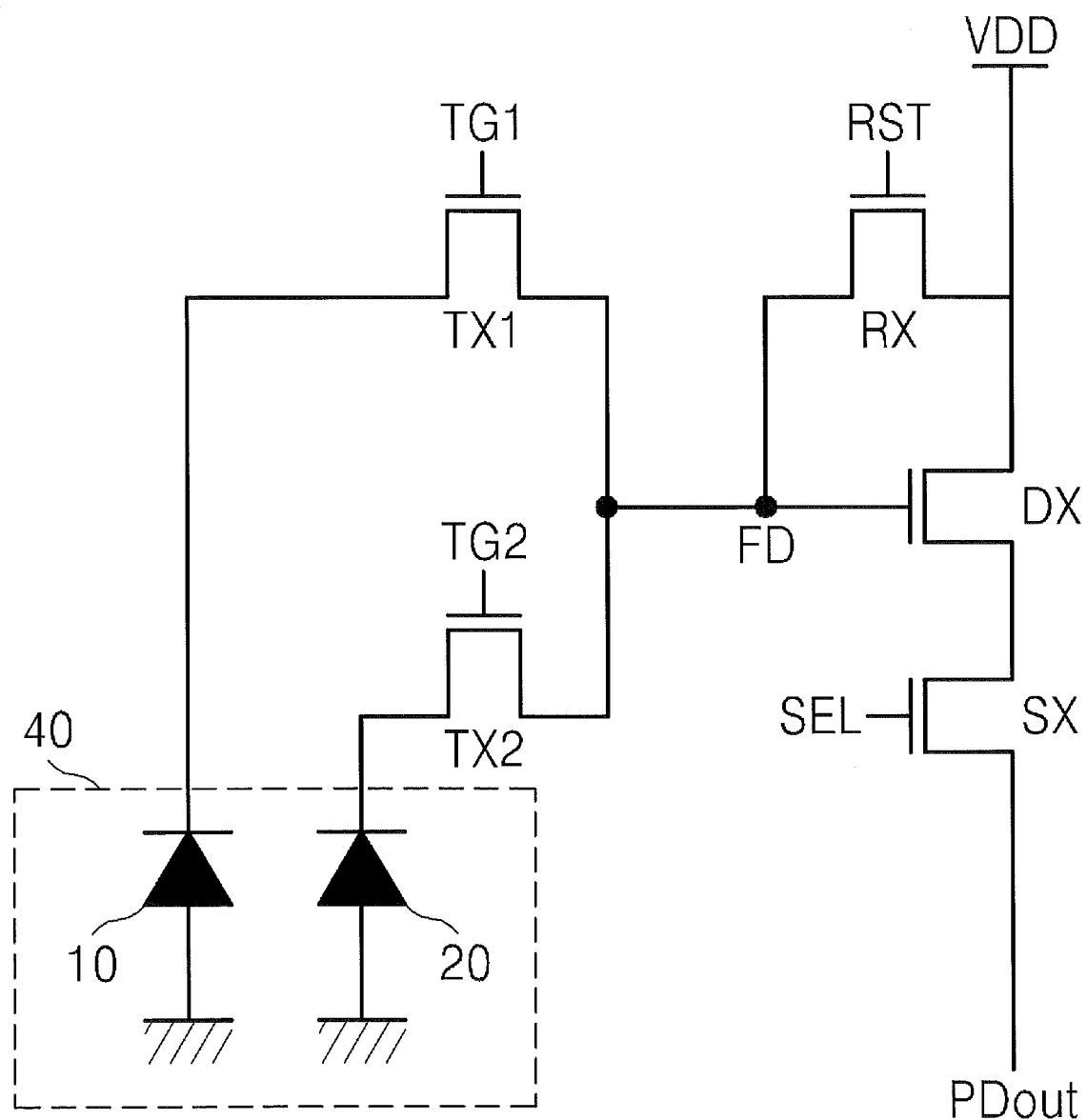
FIG. 5A shows a circuit diagram which includes a pixel of the image sensor illustrated in FIG. 4 and a readout circuit.

FIG. 4 shows a sectional diagram of a pixel of an image sensor including transfer gates according to embodiments of the present invention, and FIG. 5A shows a circuit diagram including a pixel of the image sensor illustrated in FIG. 4 and a readout circuit. Referring to FIG. 4, the pixel 40 of an image sensor includes the first photoelectric conversion element 10, the photoelectron barrier 15, the second photoelectric conversion element 20, the reflection film 30, a first transmission gate TX1 and a second transmission gate TX2. Referring to FIGS. 1 and 4, same numeral numbers 10, 15, 20 and 30 have the same function and structure.

Referring to FIGS. 4 and 5A, the first transmission gate TX1 transmits a first electrical signal, generated by the first photoelectric conversion element 10, to a floating diffusion node (FD) in response to a first gating signal (TG1). The second transmission gate TX2 transmits a second electrical signal, generated by the second photoelectric conversion element 20, to the floating diffusion node (FD) in response to a second gating signal TG2. An activation time point of the first gating signal TG1 and an activation time point of the second gating signal TG2 are different each other.

The pixel 40 of an image sensor illustrated in FIGS. 1 and 4 may further include a color filter formed at (on or over) an upper part of the first photoelectric conversion element 10.

When the color filter is a white filter, the first photoelectric conversion element 10 may generate a first electrical signal in response to wavelengths in a blue region of incident light (i.e., visible light), penetrating the white filter. The second photoelectric conversion element 20 may generate a second electrical signal in response to wavelengths in a green region or in a blue region of an incident light penetrating the photoelectron barrier 15.

When the color filter is a magenta filter, the first photoelectric conversion element 10 may generate a first electrical signal in response to wavelengths in a blue region of an incident penetrating the magenta filter. The second photoelectric conversion element 20 may generate a second electrical signal in response to wavelengths in a red region of an incident light penetrating the photoelectron barrier 15.

When the color filter is a green filter, the first photoelectric conversion element 10 may generate a first electrical signal in response to some of wavelengths in a green region of an incident light penetrating the green filter. The second photoelectric conversion element 20 may generate a second electrical signal in response to the others of wavelengths in the green region of an incident light penetrating the photoelectron barrier 15.

Figure 5B:
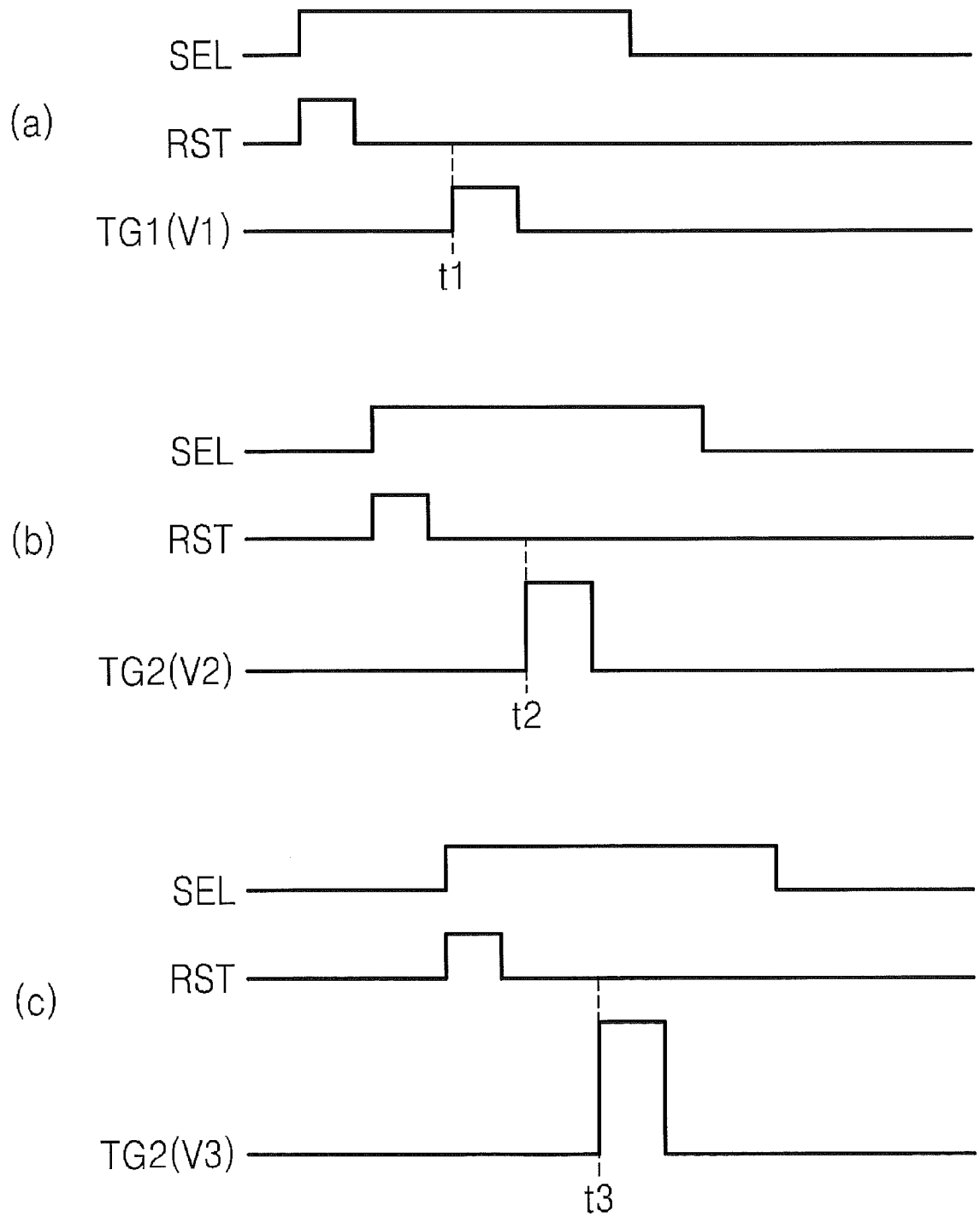
FIG. 5B shows a timing diagram of signals for controlling an operation of the circuit illustrated in FIG. 5A.

FIG. 5B shows a timing diagram of signals for controlling an operation of a circuit illustrated in FIG. 5A. Referring to FIGS. 5A and 5B, the pixel 40 of an image sensor may include two-layer photoelectric conversion elements (i.e., the first photoelectric conversion element 10 and the second photoelectric conversion element 20). The floating diffusion node FD may be reset by a reset circuit RX switched in response to a reset signal RST. A drive transistor DX performing a function of a source follower buffer amplifier may perform a buffering operation in response to an electrical signal of the floating diffusion node FD. A selection transistor SX may output a pixel signal PDout output from the drive transistor DX to a column line in response to a control signal SEL.

The first transmission gate TX1 transmits a first electrical signal generated by the first photoelectric conversion element 10 to the floating diffusion node FD in response to a first gating signal TG1(V1) having a first level. The second transmission gate TX2 may transmit some of a second electrical signal, which is generated by the second photoelectric conversion element 20, to the floating diffusion node FD in response to a second gating signal TG2(V2) having a second level, and transmit the remaining portion of the second electrical signal, which is generated by the second photoelectric conversion element 20, to the floating diffusion node FD in response to the second gating signal TG2(V3) having a third level.

FIG. 6 shows a sectional diagram of a pixel of an image sensor according to another example embodiment. Referring to FIG. 6, a pixel 41 of an image sensor includes the first photoelectric conversion element 10, the second photoelectric conversion element 20, a reflection film 30, a transparent electrode 35 and an electrode TX3.

The first photoelectric conversion element 10 may generate a first electrical signal in response to an incident light and be embodied as a PN junction photodiode where a P-type semiconductor layer P and an N-type semiconductor layer N are formed. The second photoelectric conversion element 20 formed at (below or under) a lower part of the first photoelectric conversion element 10 generates a second electrical signal in response to an incident light penetrating the first photoelectric conversion element 10. The second photoelectric conversion element 20 may be embodied as a PN junction diode where a P-type semiconductor layer P− and an N-type semiconductor layer N− are formed.

Figure 7:
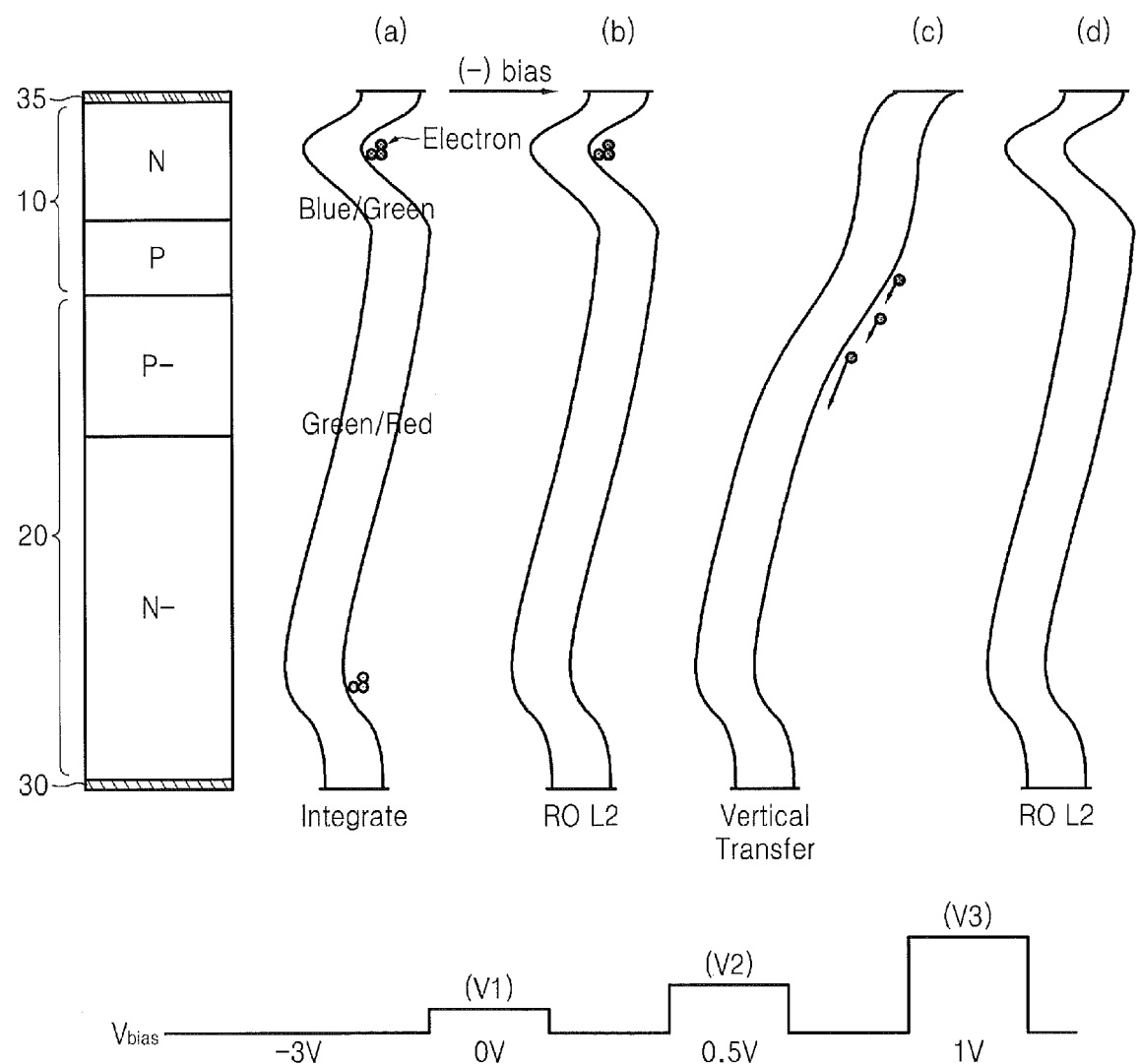
FIG. 7 shows a movement of optical charges, which are generated in each of the first photoelectric conversion element and the second photoelectric conversion element illustrated in FIG. 6, successively.

The transparent electrode 35 may be an indium tin oxide (ITO). The transparent electrode 35 is formed with a predetermined thickness on an upper part of the first photoelectric conversion element 10 and receives a bias voltage Vbias supplied from outside. An electrical signal, e.g., a photo-charge, which is generated in each of the first photoelectric conversion element 10 and the second photoelectric conversion element 20, moves to an electrode TX3 by a bias voltage Vbias as illustrated in FIG. 7. According to embodiments, the electrode TX3 may be a part of the floating diffusion node FD. According to another example embodiment, the electrode TX3 may be a transmission gate transmitting an electrical signal (e.g., a photo-charge), which is generated in each of the first photoelectric conversion element 10 and the second photoelectric conversion element 20, to the floating diffusion node FD.

On or above an upper part of the transparent electrode 35, a color filter may be embodied. An image sensor including the pixel 41 may be a CMOS image sensor having a backside illumination (BSI) structure. The reflection film 30 is formed below or under a lower part of the second photoelectric conversion element 20 and performs a function of reflecting an incident light penetrating the second photoelectric conversion element 20 to inside of the second photoelectric conversion element 20.

FIG. 7 shows a movement of photo-charges, which are generated in each of the first photoelectric conversion element and the second photoelectric conversion element illustrated in FIG. 6, successively. Referring to FIG. 7, (a) shows a process that photo-charges generated in each of the first photoelectric conversion element 10 and the second photoelectric conversion element 20 are accumulated in N-type region N and N− formed in each of the first photoelectric conversion element 10 and the second photoelectric conversion element 20; (b) shows a process of readout on photo-charges generated in response to first wavelengths among photo-charges accumulated in a N type region N− of the second photoelectric conversion element 20 when a bias voltage, e.g., 0V, is supplied to the transparent electrode 35. The first wavelengths may be wavelengths in a green region or in a red region; (c) shows a process of readout on photo-charges generated in the second photoelectric conversion element 20 in response to second wavelengths when a higher voltage, e.g., 0.5V, than a bias voltage, e.g., 0V, supplied to the (b) stage is supplied to the transparent electrode 35. The second wavelengths may be wavelengths in a green region or in a red region; and (d) shows a process of readout on photo-charges generated in an N-type region (N) of the first photoelectric conversion element 10 when a higher voltage, e.g., 1V, than the bias voltage, e.g., 0.5V, supplied to the (c) stage is supplied to the transparent electrode 35. A bias voltage Vbias supplied to the transparent electrode 35 controls transmission of photo-charges, which are generated in each of the first photoelectric conversion element 10 and the second photoelectric conversion element 20, to the node TX3.

Figure 8:
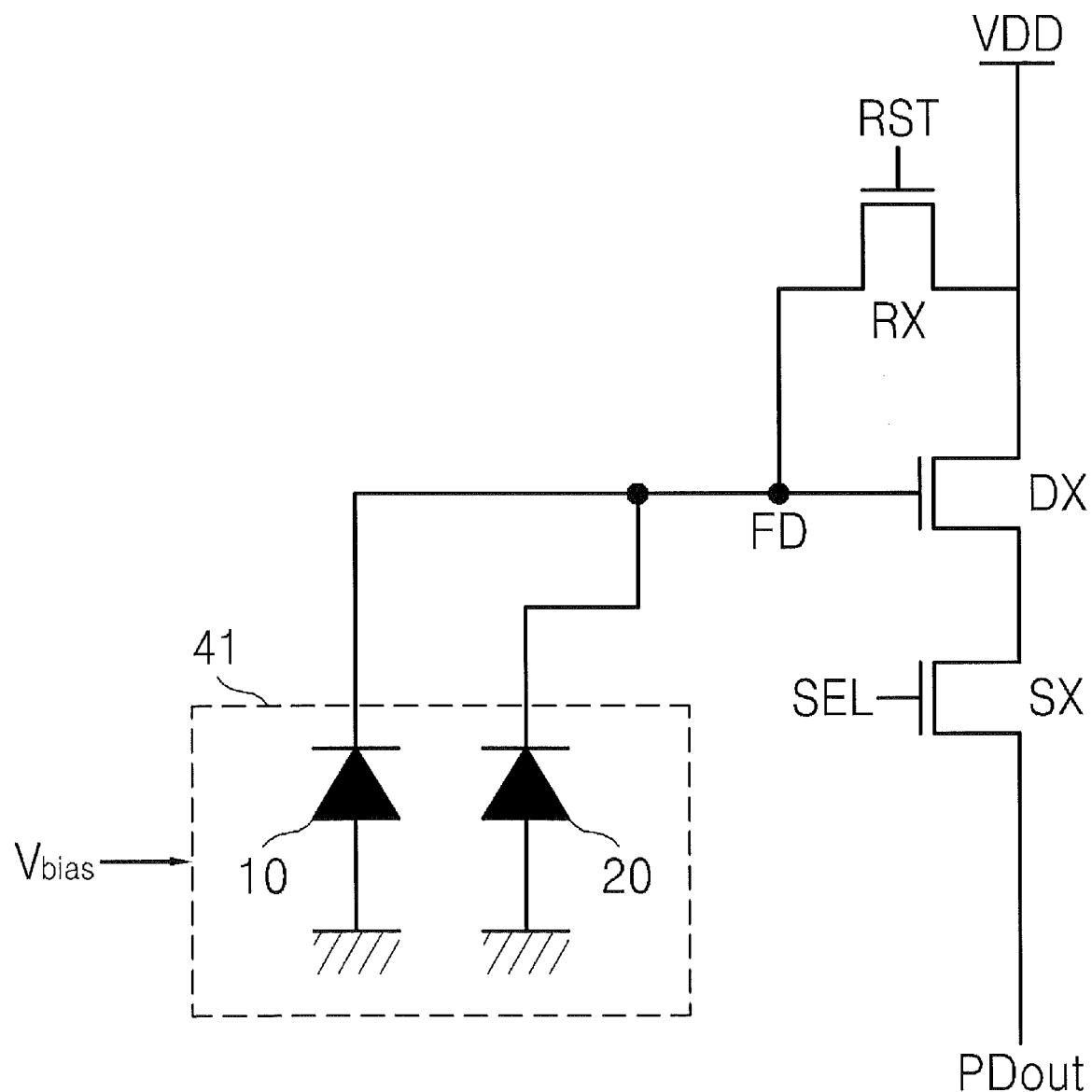
FIG. 8 shows a circuit diagram including a pixel of an image sensor illustrated in FIG. 6 and a readout circuit.

FIG. 8 shows a circuit diagram including a pixel of the image sensor illustrated in FIG. 6 and a readout circuit. Referring to FIGS. 6 to 8, the image pixel 41 includes the first photoelectric conversion element 10, the second photoelectric conversion element 20 and the transparent electrode 35. A bias voltage Vbias supplied from outside controls transmission of photo-charges generated by the first photoelectric conversion element to the floating diffusion node FD.

The first photoelectric conversion element 10 connected to the floating diffusion node FD transmits photo-charges generated by the first photoelectric conversion element 10 to the floating diffusion node FD in response to a bias voltage V1 having a first level. Accordingly, a pixel signal PDout, which is generated by photo charges transmitted to the floating diffusion node FD, is output to a column line through a drive transistor DX and a selective transistor SX. The second photoelectric conversion element 20 connected to the floating diffusion node FD transmits photo-charges generated by the second photoelectric conversion element 20 to the floating diffusion node FD in response to a bias voltage V2 or V3 having a second level or a third level. Accordingly, a pixel signal PDout generated by the photo-charges transmitted to the floating diffusion node FD is output to a column line through the drive transistor DX and the selective transistor SX.

Figure 9:
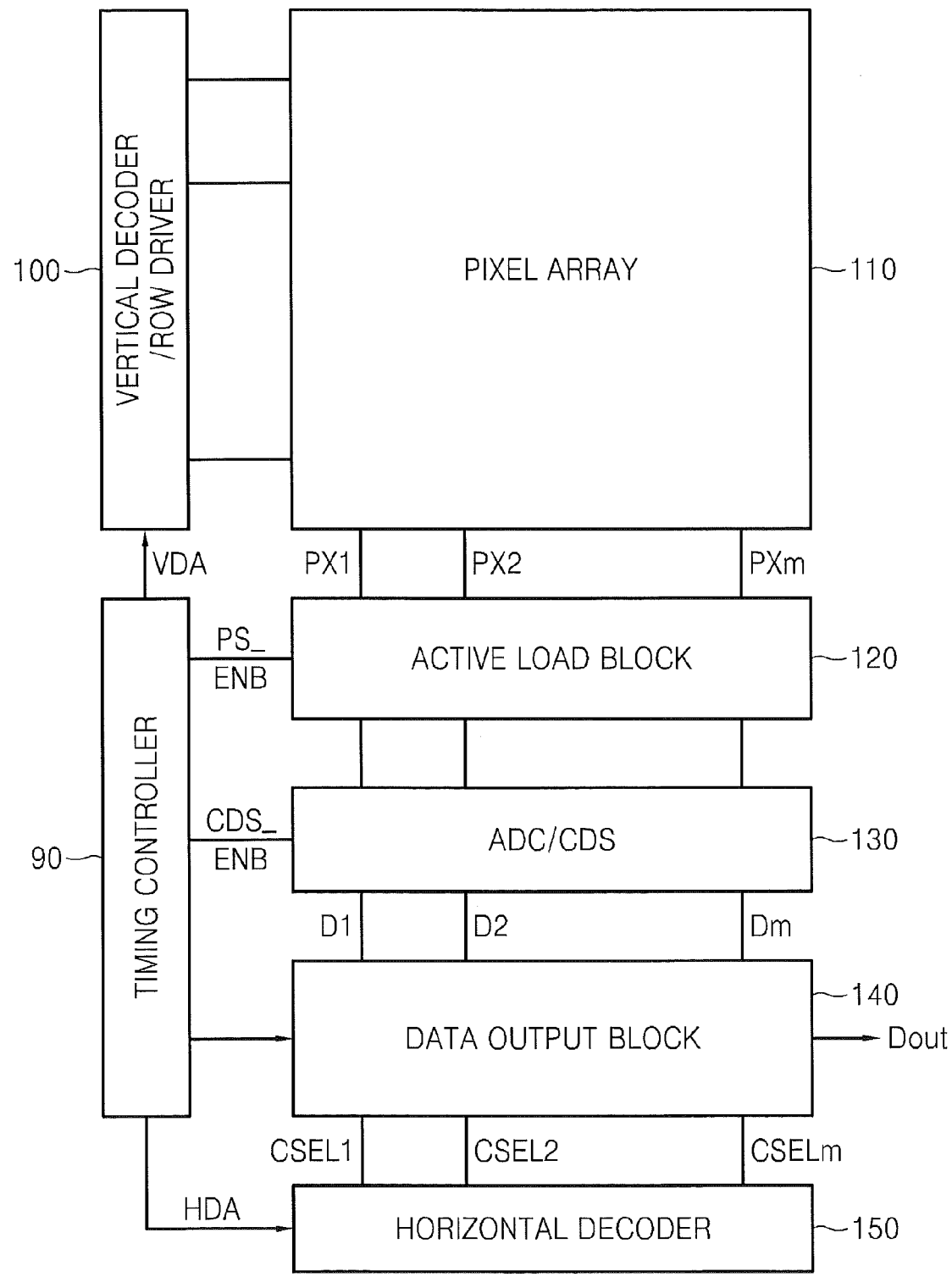
FIG. 9 shows a block diagram of an image sensor including a pixel of the image sensor illustrated in FIG. 1 or 6.

According to embodiments, a level and a supply time point of each bias voltage Vbias supplied to the transparent electrode 35 may be controlled by a vertical decoder/row driver illustrated in FIG. 9.

FIG. 9 shows a block diagram of an image sensor including a pixel of the image sensor illustrated in FIG. 6. Referring to FIG. 9, the image sensor 200 may include a timing controller 90, a vertical decoder/row driver 100, a pixel array 110, an active load block 120, a readout circuit 130, a data output block 140 and a horizontal decoder 150.

The timing controller 90 may control an operation of each component 100, 110, 120, 130, 140 and 150. The vertical decoder/row driver 100 may select one of a plurality of rows embodied in the pixel array 110 in response to a row address VDA output from the timing controller 90. The pixel array 110 may include a plurality of pixels and each of the plurality of pixels may be embodied as the pixel 40 or 41 having a two-layer structure illustrated in FIG. 1 or 6. The pixel array 110 may include a plurality of column lines PX1 to PXm. A plurality of pixels arranged in a column direction may be connected to each of the plurality of column lines PX1 to PXm.

The active load block 120 controls transmission of a pixel signal output from each of the plurality of column lines PX1 to PXm to the readout circuit 130. The readout circuit 130 is a signal processing circuit, which may process, e.g., correlated double sampling (CDS) or analog-to-digital converting (ADC), each pixel signal generated from each column line PX1 to PXm. According to embodiments, the readout circuit 130 may include a plurality of correlated double sampling (CDS) circuits. Each of the plurality of CDS circuits may be connected to each of the plurality of column lines PX1 to PXm, perform a CDS on a pixel signal output from each of the plurality of column lines PX1 to PXm and generate a correlated double sampled pixel signal.

According to another example embodiment, the readout circuit 130 may further include a plurality of analog to digital converters. Each of the plurality of analog to digital converters may be connected to each of the plurality of CDS circuits and convert a correlated double sampled pixel signal to a digital signal.

The data output block 140 may output a digital signal output from the readout circuit 130 as an output signal Dout. The data output block 140 may output a digital signal output from the readout circuit 130 as an output signal Dout in response to each of column selective signals CSEL1 to CSELm output from a horizontal decoder 150.

The horizontal decoder 150 decodes a column address HAD output from the timing controller 90 and generates a plurality of column selective signals CSEL1 to CSELm.

The timing controller 90 generates, in response to control signals input from outside, at least one control signal for controlling an operation of the vertical decoder/row driver 100, at least one control signal PS_ENB for controlling an operation of the active load circuit 120, at least one control signal CDS_ENB for controlling an operation of the readout circuit 130, at least one control signal for controlling an operation of the data output block 140 and at least one control signal for controlling an operation of the horizontal decoder.

When the image sensor 200 is embodied as the pixels 41 illustrated in FIG. 6, the image sensor 200 may further include a voltage generator supplying a bias voltage Vbias to the transparent electrode 35.

Figure 10:
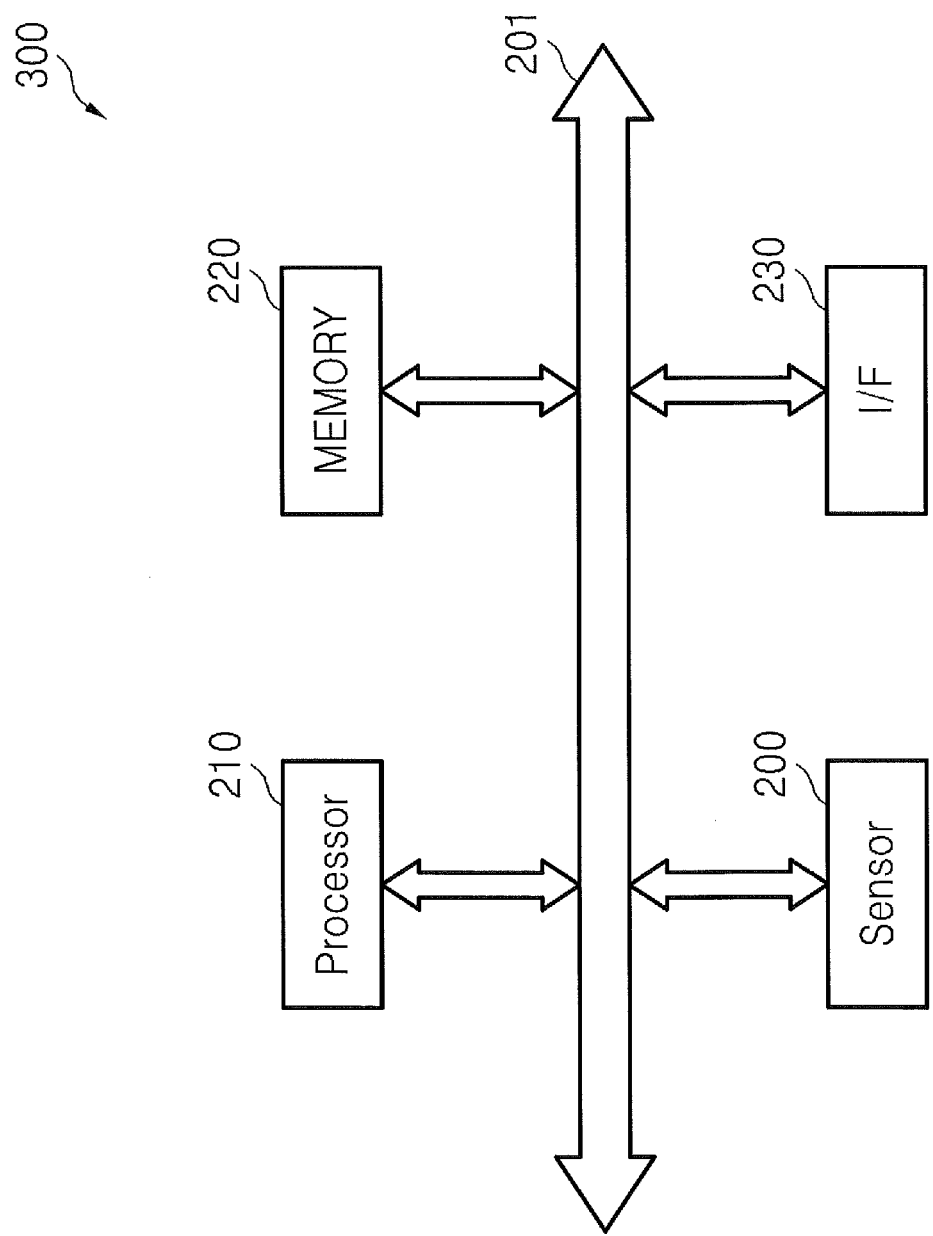
FIG. 10 shows a block diagram of an image processing apparatus including the image sensor illustrated in FIG. 9.

FIG. 10 shows a block diagram of an image processing apparatus including the image sensor illustrated in FIG. 9. Referring to FIG. 10, the image processing apparatus 300 includes a digital camera, a mobile phone or smart phone having a digital camera built-in or every kind of electronic device having a digital camera built-in. The image processing apparatus 300 may process two dimensional image information or three dimensional image information.

The image processing apparatus 300 may include the image sensor 200 having a two layer structure illustrated in FIG. 1 or 6 and a processor 210 for controlling an operation of the image sensor 200. The image processing apparatus 300 may include a memory device 220 which may store a still image or a video captured by the image sensor 200. The memory device 220 may be embodied as a non-volatile memory device. The non-volatile memory device may include a plurality of non-volatile memory cells.

The image processing apparatus 300 may further include an interface 230. The interface 230 may be an output device like an image display device. According to embodiments, the interface 230 may be an input device such as a keyboard, a mouse or a touch pad. Image data generated by the image sensor 200 may be stored in the memory device 220 or displayed through the image display device under a control of the processor 210.

The image sensor according to embodiments of the present invention may get a vivid color by using a two-layer structure.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An image sensor, comprising:
    a second photoelectric conversion device disposed in a substrate;
    a first photoelectric conversion device extending between said second photoelectric conversion device and a light receiving surface of the substrate;
    a photoelectron barrier extending between said first and second photoelectric conversion devices;
    means, electrically coupled to first and second cathodes of said first and second photoelectric conversion devices, for transferring photoelectrons generated in said first and second photoelectric conversion devices to a floating diffusion region in the substrate in response to first and second gating signals, respectively, which are active during non-overlapping time intervals; and
    a reflection film on a surface of the substrate opposite the light receiving surface for reflecting incident light penetrating the second photoelectric conversion device to inside of the second photoelectric conversion device.

2. The image sensor of claim 1, wherein said first and second photoelectric conversion devices comprise first and second PN rectifying junctions, respectively; and wherein the second PN rectifying junction is more lightly doped with P-type and N-type impurities relative to the first PN rectifying junction.

3. The image sensor of claim 2, wherein said photoelectron barrier comprises an optically transparent electrically insulating material.

4. The image sensor of claim 1, wherein said photoelectron barrier comprises a material selected from a group consisting of silicon dioxide, silicon nitride and silicon oxynitride.

5. The image sensor of claim 3, wherein said photoelectron barrier forms a first interface with a P-type region in said first photoelectric conversion device and a second interface with a P-type region in said second photoelectric conversion device.

6. The image sensor of claim 1, wherein said transferring means comprises first and second MOS transistors having respective source/drain regions that form non-rectifying junctions with the floating diffusion region; and wherein the first and second MOS transistors have gate electrodes that are responsive to the first and second gating signals, respectively.

7. An image sensor comprising:
    a first photoelectric conversion element generating a first electrical signal in response to an incident light;

a photoelectron barrier at a lower part of the first photoelectric conversion element;

a second photoelectric conversion element, which is at a lower part of the photoelectron barrier, generating a second electrical signal in response to an incident light penetrating the photoelectron barrier; and a reflection film at a lower part of the second photoelectric conversion element and reflecting an incident light penetrating the second photoelectric conversion element to inside of the second photoelectric conversion element, wherein the reflection film is at a surface of the substrate opposite the light receiving surface.

8. The image sensor of claim 7, wherein the photoelectron barrier comprises a silicon oxide film (SiO2), a silicon nitride film (SiN) or a silicon oxynitride film (SiON).

9. The image sensor of claim 7, further comprising a white filter at an upper part of the first photoelectric conversion element,
wherein the first photoelectric conversion element generates the first electrical signal in response to wavelengths in a blue region of the incident light,
wherein the second photoelectric conversion element generates the second electrical signal in response to wavelengths in a green region or in a blue region of an incident light penetrating the photoelectron barrier.

10. The image sensor of claim 7, further comprising a magenta filter at an upper part of the first photoelectric conversion element,
wherein the first photoelectric conversion element generates the first electrical signal in response to wavelengths in a blue region of the incident light,
wherein the second photoelectric conversion element generates the second electrical signal in response to wavelengths in a red region of an incident light penetrating the photoelectron barrier.

11. The image sensor of claim 7, further comprising a green filter at an upper part of the first photoelectric conversion element,
wherein the first photoelectric conversion element generates the first electrical signal in response to wavelengths in a green region of the incident light,
wherein the second photoelectric conversion element generates the second electrical signal in response to wavelengths in the green region of an incident light penetrating the photoelectron barrier.

12. An image sensor comprising:
a transparent electrode;
a first photoelectric conversion element for generating a first electrical signal in response to an incident light penetrating the transparent electrode;
a second photoelectric conversion element for generating a second electrical signal in response to the incident light penetrating the first photoelectric conversion element; and
a reflection film on a surface of the substrate opposite the light receiving surface for reflecting the incident light penetrating the second photoelectric conversion element to inside of the second photoelectric conversion element.

13. The image sensor of claim 12, wherein a bias voltage is supplied to the transparent electrode.

14. The image sensor of claim 12, wherein the image sensor is a backside illumination (BIS) CMOS image sensor.

15. An image processing apparatus comprising:
the image sensor of claim 7; and
a processor circuit configured to control operations of the image sensor.

16. The image processing apparatus of claim 15, wherein the image sensor further comprises a reflection film which is at a lower part of the second photoelectric conversion element and reflects an incident light penetrating the second photoelectric conversion element to inside of the second photoelectric conversion element.

17. An image processing apparatus comprising:
the image sensor of claim 12; and
a processor circuit configured to control operations of the image sensor.

* * * * *